United States Patent
Diem (10) Patent No.: US 8,011,244 B2
(45) Date of Patent: Sep. 6, 2011

(54) MICROSYSTEM, AND MORE PARTICULARLY A MICROGYROMETER, INCLUDES AT LEAST TWO MECHANICALLY COUPLED OSCILLATING MASSES

(75) Inventor: Bernard Diem, Echirolles (FR)

(73) Assignee: Commissariat a l'Energie Atomique, Paris (FR)

( * ) Notice: Subject to any disclaimer, the term of this patent is extended or adjusted under 35 U.S.C. 154(b) by 623 days.

(21) Appl. No.: 12/086,495

(22) PCT Filed: Dec. 22, 2006

(86) PCT No.: PCT/FR2006/002846
§ 371 (c)(1),
(2), (4) Date: Jun. 13, 2008

(87) PCT Pub. No.: WO2007/077353
PCT Pub. Date: Jul. 12, 2007

(65) Prior Publication Data
US 2010/0154543 A1  Jun. 24, 2010

(30) Foreign Application Priority Data
Dec. 23, 2005  (FR) ...................... 05 13215

(51) Int. Cl.
*G01P 9/04* (2006.01)
*G01C 19/56* (2006.01)

(52) U.S. Cl. .................. 73/504.12; 73/504.14

(58) Field of Classification Search ............... 73/504.12, 73/504.14, 504.16, 504.04, 514.36
See application file for complete search history.

(56) References Cited

U.S. PATENT DOCUMENTS

| | | | |
|---|---|---|---|
| 5,241,861 A | 9/1993 | Hulsing, II | |
| 5,635,638 A | 6/1997 | Geen | |
| 5,728,936 A | 3/1998 | Lutz | |
| 6,752,017 B2 | 6/2004 | Willig et al. | |
| 6,860,151 B2 * | 3/2005 | Platt et al. | 73/504.12 |
| 7,036,372 B2 * | 5/2006 | Chojnacki et al. | 73/504.12 |
| 7,204,144 B2 * | 4/2007 | Geen | 73/504.14 |
| 7,287,428 B2 * | 10/2007 | Green | 73/504.12 |
| 7,347,094 B2 * | 3/2008 | Geen et al. | 73/504.12 |
| 7,357,025 B2 * | 4/2008 | Geen | 73/504.12 |
| 7,421,897 B2 * | 9/2008 | Geen et al. | 73/504.12 |
| 2003/0101815 A1 | 6/2003 | Orsier | |
| 2004/0154397 A1 | 8/2004 | Platt et al. | |
| 2005/0072231 A1 | 4/2005 | Chojnacki et al. | |
| 2005/0229705 A1 | 10/2005 | Geen | |

FOREIGN PATENT DOCUMENTS

| | | |
|---|---|---|
| FR | 2 809 174 A1 | 11/2001 |
| WO | WO 96/05480 A1 | 2/1996 |
| WO | WO 2004/042324 A1 | 5/2004 |

* cited by examiner

*Primary Examiner* — Helen C. Kwok
(74) *Attorney, Agent, or Firm* — Oliff & Berridge, PLC (57) ABSTRACT

A microsystem, and more particularly a microgyrometer, includes at least two mechanically coupled oscillating masses.
The microsystem is achieved in a flat substrate. The oscillating masses are connected to the substrate by suspension springs. The oscillating masses are coupled together by a rigid coupling bar so as to produce an anti-phase movement of the oscillating masses when driven by an excitation device in a predefined excitation direction. The coupling bar is connected to intermediate zones of the corresponding suspension springs. The suspension springs are arranged on opposite sides of the oscillating masses. An intermediate zone is arranged between a first end of a suspension spring, which is fixed to the corresponding oscillating mass, and a second end of the suspension spring, which is fixed to the substrate by a corresponding anchoring point.

15 Claims, 5 Drawing Sheets

MICROSYSTEM, AND MORE PARTICULARLY A MICROGYROMETER, INCLUDES AT LEAST TWO MECHANICALLY COUPLED OSCILLATING MASSES

BACKGROUND OF THE INVENTION

The invention relates to a microsystem, more particularly a microgyrometer, made in a flat substrate and comprising:
at least two oscillating masses connected to the substrate by elastic suspension means,
and means for coupling two adjacent oscillating masses able to produce an anti-phase movement of said oscillating masses when excitation of the latter is performed in a predefined excitation direction.

STATE OF THE ART

In the field of microsystems of the sensor or actuator type, it is known to use a microgyrometer for inertial measurement of the speed of rotation. To measure the speed, a microgyrometer conventionally uses the Coriolis force generated by a vibrating mass due to the effect of a rotation. The Coriolis force is generated in a direction perpendicular to the excitation vibration and to the axis of rotation.

A microgyrometer is a component that is preferably micromachined in the plane of a substrate and conventionally comprising at least two oscillating masses driven by any suitable excitation means in the same oscillation direction, but in an opposite direction of movement (anti-phase movement). Oscillating masses conventionally integrate detection elements designed for detection of the Coriolis force in their structure.

Two major detection families exist. The first family consists in detection in the plane of the substrate on which the microgyrometer is produced, with an axis of rotation perpendicular to the substrate. The second family consists in detection perpendicular to the plane of the substrate, with an axis of rotation in the plane of the substrate.

For technological reasons of simplicity and cost, a microgyrometer with detection in the plane of the substrate is more often than not used. For example, the documents WO-A-9605480, WO-A-2004042324 and U.S. Pat. No. 6,752,017 each describe a microgyrometer with excitation and detection in the plane of the substrate.

The document WO-A-2004042324 in particular describes a microgyrometer with coupling of the oscillating masses by springs enabling detection to be performed in a single direction. However, this type of coupling considerably reduces the sensitivity of the microgyrometer.

U.S. Pat. No. 6,752,017 in particular describes a microgyrometer with a coupling system of the oscillating masses enabling the in-phase and anti-phase mode of vibrations to be separated. However, the measuring efficiency is lesser and operation of the microgyrometer is not optimal.

To improve the operation of a microgyrometer, it is known to make a differential measurement, i.e. to make a measurement of the Coriolis force when the oscillating masses are excited in anti-phase. Vibration of the masses therefore has to be forced to a higher frequency than the fundamental frequency.

For example, U.S. Pat. Nos. 5,635,638, 5,728,936 and 5,241,861 each propose a microgyrometer, the mode of vibration of which in anti-phase mode is forced.

U.S. Pat. No. 5,635,638 in particular describes a microgyrometer with excitation and detection in the plane of the substrate, with a coupling system of the masses by beams. However, an asymmetry of the system is observed, which leads to much less well controlled movements of the oscillating masses.

U.S. Pat. Nos. 5,728,936 and 5,241,861 each describe a microgyrometer with a coupling system by connection of the opposite corners of the oscillating masses by means of a rotating link to force the mode of vibration to anti-phase mode. However, this type of microgyrometer is very difficult to implement and detection does not prove to be very efficient, as it does not participate in the inertial mass of the microgyrometer.

The microgyrometers described above operate either at a frequency other than the fundamental frequency or with an equal and opposite imposed movement of the oscillating masses, which proves very restrictive for controlling the microgyrometer manufacturing technology.

Moreover, the document US 2004/154397 also describes a microgyrometer with two oscillating masses designed to oscillate in anti-phase mode to determine in particular the speed of rotation. The oscillating masses are connected to a substrate by suspension means which are coupled to one another by joining bars. However, such a microgyrometer performs detection perpendicular to the plane of the substrate and the position of the joining bars is dissymmetric. This results in particular in disturbed operation of the microgyrometer.

The document US 2005/072231 also describes a microsystem, more particularly an angular speed sensor, comprising two oscillating masses on a substrate, connected by deformable interconnecting branches and by rigid interconnecting branches. However, such a connection of the oscillating masses by rigid branches in particular imposes a perfectly identical motion of the two oscillating masses in anti-phase mode, which is practically impossible from an operational point of view.

Whatever the known microgyrometer, it therefore does not provide optimal operation

OBJECT OF THE INVENTION

The object of the invention is to remedy all the above-mentioned shortcomings and to provide a microsystem with coupled oscillating masses, more particularly a microgyrometer with two oscillating masses, that is of simple design, easy to implement and which presents optimal operation.

The object of the invention is attained by the appended claims, and more particularly by the fact that:
the microsystem comprises at least one pair of elastic suspension means arranged on opposite sides of two adjacent oscillating masses and having an axis of least stiffness oriented in said excitation direction,
said coupling means connect intermediate zones of said pair of elastic suspension means,
each intermediate zone is arranged between a first end of the associated elastic suspension means fixed onto the corresponding oscillating mass, and a second end of the associated elastic suspension means fixed onto the substrate by a corresponding anchoring point,
said intermediate zones, connected by the coupling means, are arranged on each side of an axis parallel to the excitation direction.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

With reference to FIGS. 1 to 6, microsystem 1 is more particularly a microgyrometer designed for determining a speed of rotation by measuring the vibration of mechanically coupled oscillating masses. Microgyrometer 1 is achieved for example by micro-machining in a flat substrate (not represented in the figures for the sake of clarity), defining the representation plane of FIGS. 1 to 6.

Figure 1:
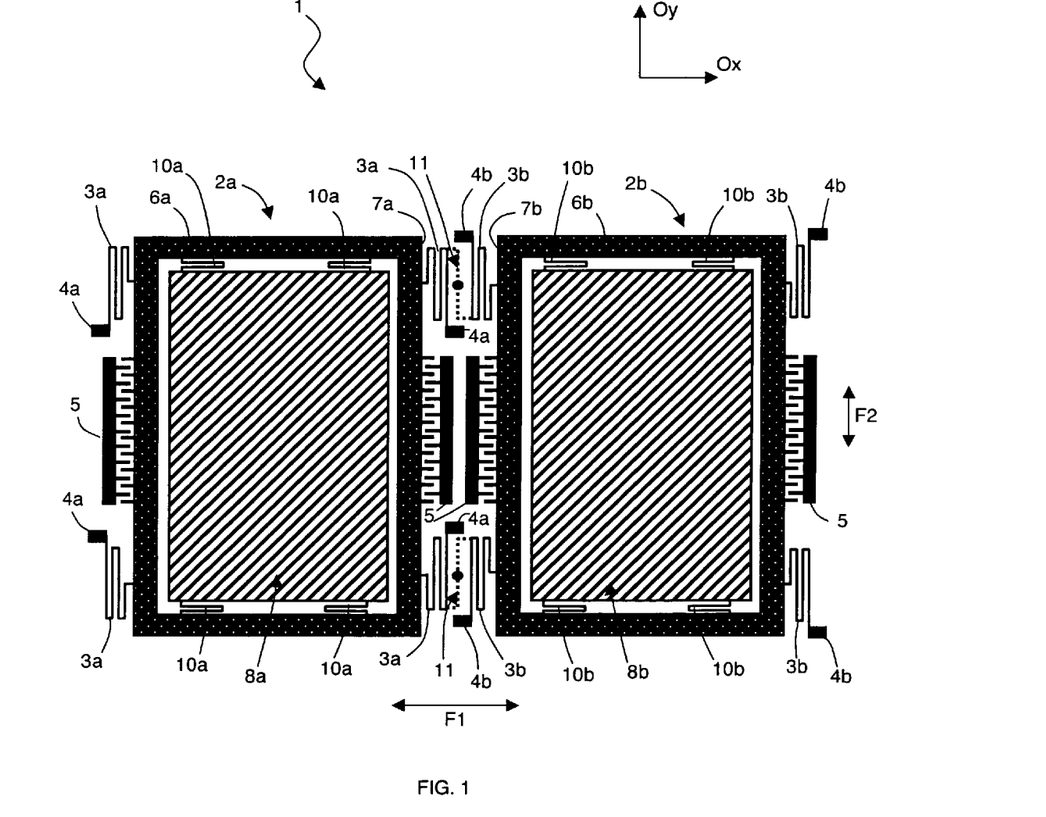
FIG. 1 schematically represents a top view of an embodiment of a microsystem according to the invention, more particularly a microgyrometer, with two mechanically coupled oscillating masses.

In the particular embodiment represented in FIG. 1, microgyrometer 1 preferably comprises two oscillating masses 2a, 2b, of substantially rectangular general shape and preferably identical and symmetrical in themself and with respect to one another. Each oscillating mass 2a, 2b is elastically suspended on the substrate by means of suspension springs 3a, 3b.

Figure 2:
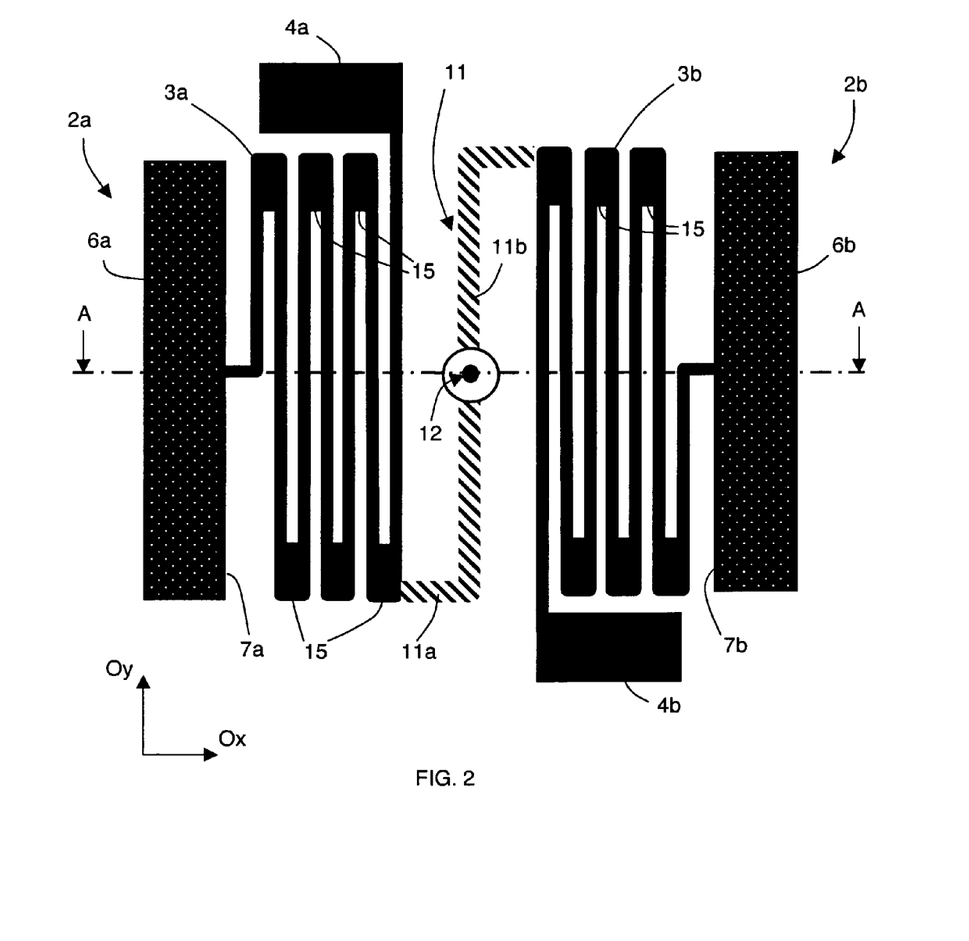
FIG. 2 schematically represents a very enlarged partial top view of the coupling means of the oscillating masses of the microgyrometer according to FIG. 1.

In FIGS. 1 and 2, suspension springs 3a, 3b are springs in the form of meanders presenting one or more successive U-shaped branches in one and the same plane parallel to the substrate. Suspension springs 3a, 3b are anchored at their first end on oscillating masses 2a, 2b and at their second end to the substrate by means of corresponding anchoring points 4a, 4b.

In FIG. 1, each oscillating mass 2a, 2b is suspended on the substrate respectively by four suspension springs 3a, 3b and four corresponding anchoring points 4a, 4b. For example, anchoring points 4a connecting oscillating mass 2a to the substrate are arranged substantially towards the central part of oscillating mass 2a. Anchoring points 4b connecting oscillating mass 2b to the substrate are arranged substantially towards the outside and at the four corners of oscillating mass 2b.

Each oscillating mass 2a, 2b is driven in vibration in an excitation direction Ox, in the direction of arrow F1, by means for example of interdigital capacitive combs 5 arranged on each side of each oscillating mass 2a, 2b.

As represented in FIG. 1, each oscillating mass 2a, 2b forms an excitation frame 6a, 6b on which the first ends of suspension springs 3a, 3b and interdigital capacitive combs 5 are fixed. Frames 6a, 6b thus present two opposite sides, respectively 7a, 7b, perpendicularly to the excitation direction Ox. Opposite sides 7a, 7b are designed to be mechanically coupled and each preferably present two suspension springs 3a, 3b.

Oscillating masses 2a, 2b each also comprise detection means, participating in the inertial mass, surrounded by excitation frames 6a, 6b and respectively composed of a mobile detection element 8a, 8b.

Each mobile detection element 8a, 8b is connected to corresponding excitation frame 6a, 6b by elastic return springs 10a, 10b which allow a degree of freedom along the axis Oy.

Each mobile electrode 8a, 8b vibrates in the direction Oy, in the direction of arrow F2 (FIG. 1), defining the axis of detection of the Coriolis force generated by vibration of oscillating masses 2a, 2b.

In this way, when rotation of the substrate is performed along axis Oz perpendicular to plane Ox/Oy defined by the substrate (FIG. 1), mobile detection element 8a, 8b will vibrate, in the direction of arrow F2, at the same frequency as excitation of oscillating masses 2a, 2b in the direction of arrow F1. The movement of detection element 8a, 8b is then measured to then determine the speed of rotation.

In the particular embodiment of FIG. 2, the two oscillating masses 2a, 2b of microgyrometer 1 are mechanically coupled so as to produce an anti-phase movement when excitation thereof is performed in excitation direction Ox.

Each suspension spring 3a of side 7a of excitation frame 6a associated with oscillating mass 2a is coupled to another suspension spring 3b arranged facing the latter on the opposite side 7b of excitation frame 6b associated with oscillating mass 2b (FIGS. 1 and 2). In FIGS. 1 and 2, suspension springs 3a, 3b have their axis of least stiffness oriented in excitation direction Ox and each suspension spring 3a, 3b arranged on opposite sides 7a, 7b of oscillating masses 2a, 2b is coupled with another suspension spring 3a, 3b that faces it.

In FIG. 2, suspension springs 3a, 3b are in the form of meanders with a plurality of successive U-shaped branches. One end of each suspension spring 3a, 3b is firmly secured respectively to excitation frame 6a, 6b and another end of each suspension spring 3a, 3b is firmly secured to the substrate by means of corresponding anchoring point 4a, 4b.

In FIG. 2, the two springs 3a and 3b are coupled to rigid coupling bar 11, presenting two sections 11a, 11b respectively connected to springs 3a and 3b. Coupling bar 11 is articulated in rotation about vertical pivot 12 firmly secured to the substrate.

The last branch of suspension springs 3a, 3b presents a first end fixed to the corresponding anchoring point 4a, 4b and a mobile second end. Coupling bar 11 preferably connects mobile end of the last U-shaped branch of suspension springs 3a, 3b.

Furthermore, as represented in FIG. 2, the set of ends of U-shaped branches of suspension springs 3a, 3b preferably have a thicker cross-section so as to form a substantially solid base 15 for each U-shaped branch of suspension springs 3a, 3b. The set of branches of suspension springs 3a, 3b are therefore parallel in the rest position and joined via their bases 15, forming local non-deformation zones. Tensile or compressive stressing of suspension springs 3a, 3b then results in deformation of the branches, i.e. flexing of the branches, only between two successive bases 15 of the U-shaped branches.

As represented in FIG. 2, coupling bar 11 is preferably connected to the thick mobile ends of the last branches of suspension springs 3a, 3b. Coupling bar 11 connects suspension springs 3a, 3b symmetrically with respect to the axis AA passing substantially via the centre of suspension springs 3a, 3b, to enable in particular identical movement of suspension springs 3a, 3b when anti-phase movement of associated oscillating masses 2a, 2b takes place.

Furthermore, in the particular embodiment of FIGS. 1 to 5, in which anchoring points 4a, 4b of associated oscillating masses 2a, 2b are placed in opposition to one another on each side of the axis AA parallel to the excitation direction and passing substantially through the centre of suspension springs 3a, 3b arranged facing one another (FIG. 2), suspension springs 3a, 3b are connected on zones that are symmetrical with respect to vertical pivot 12 of coupling bar 11. The mobile ends of the last branches of suspension springs 3a, 3b are thereby arranged on each side of the axis AA defining the axis of least stiffness of suspension springs 3a, 3b (FIGS. 1 and 2). The last branches of suspension springs 3a, 3b are therefore oriented "in opposition".

Such a configuration, with suspension springs 3a, 3b of oscillating masses 2a, 2b connected "in opposition" by coupling bars 11 in symmetric manner on zones having the same amplitude of movement, then provides optimal operation of microgyrometer 1, the amplitude of movement of suspension springs 3a, 3b being identical for the two oscillating masses 2a, 2b.

Figure 3:
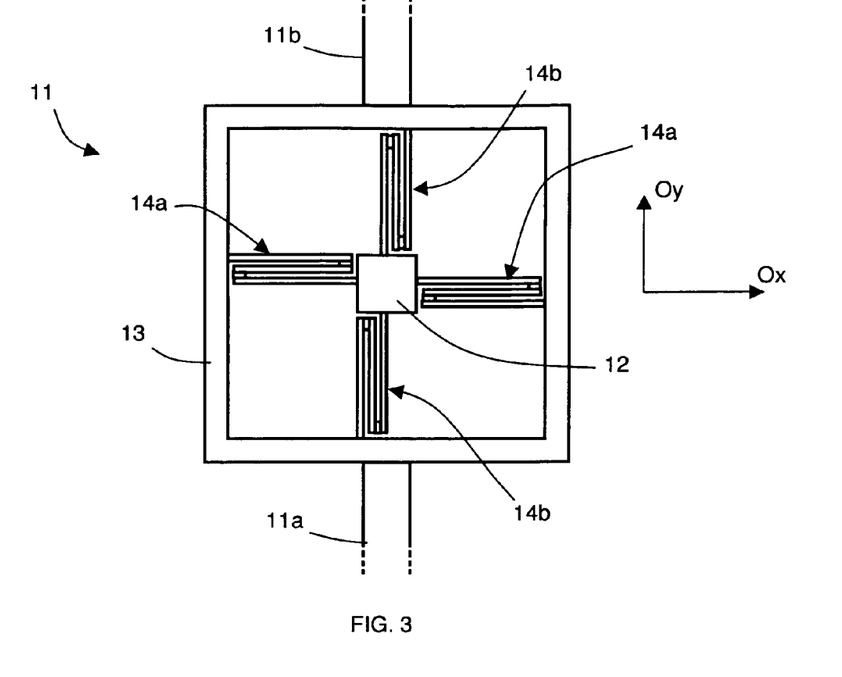
FIGS. 3 to 5 represent different alternative embodiments of articulation in rotation of the coupling means of the microgyrometer according to FIGS. 1 and 2.

In FIG. 3, representing a particular embodiment of articulation in rotation of each coupling bar 11 of microgyrometer 1, coupling bar 11 comprises a rigid frame 13, for example of square shape, on which the first ends of sections 11a, 11b of bar 11 are connected. The second ends of sections 11a, 11b, connected to corresponding suspension springs 3a, 3b, are not represented in FIGS. 3 to 5 for the sake of clarity.

Vertical pivot 12, for example of square shape, is arranged in the centre of frame 13 and connected to frame 13 by means of four elastic articulation springs 14 arranged inside frame 13. Articulation springs 14 are preferably identical to suspension springs 3a and 3b of oscillating masses 2a, 2b. Two first articulation springs 14a have an axis of least stiffness oriented perpendicularly to excitation direction Ox and are arranged on each side of pivot 12, in a manner parallel to excitation direction Ox. Each articulation spring 14a comprises a first end connected to frame 13 and a second end connected to pivot 12.

Two second articulation springs 14b, arranged perpendicularly to first articulation springs 14a, i.e. in the longitudinal direction of coupling bar 11, are arranged on each side of pivot 12 and have an axis of least stiffness oriented in excitation direction Ox. Each articulation spring 14b comprises a first end connected to frame 13 and a second end connected to pivot 12. This configuration of articulation springs 14a, 14b in particular enables a good articulation in rotation of coupling bar 11.

Figure 4:
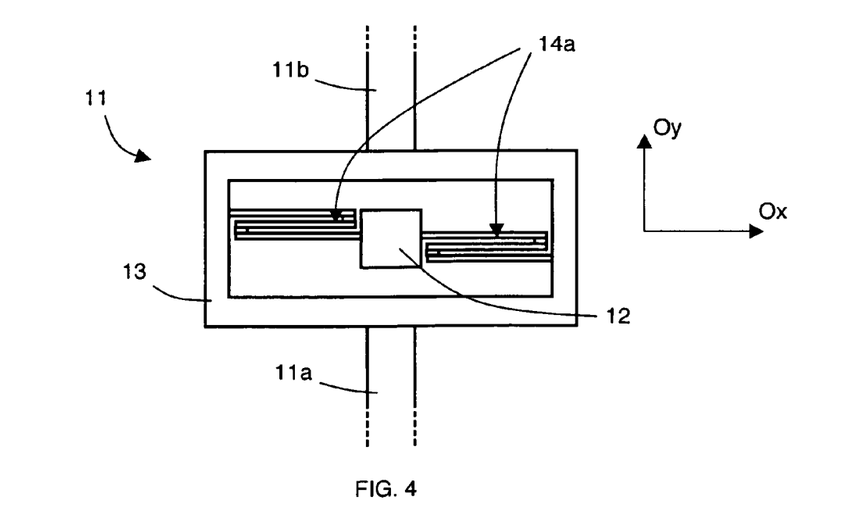

In the alternative embodiment represented in FIG. 4, coupling bar 11 differs from the one described before by rigid frame 13, of substantially rectangular shape, and by the number of articulation springs 14. Frame 13 is in fact connected to pivot 12, arranged in its centre, only by the two articulation springs 14a arranged inside frame 13 on each side of pivot 12. The two articulation springs 14a are preferably identical to articulation springs 14a represented in FIG. 3. This configuration of articulation springs 14a is in particular used in the case where there is no movement of coupling bar 11 along the axis Oy when oscillation of oscillating masses 2a, 2b takes place.

In FIGS. 3 and 4, articulation springs 14a, 14b are preferably of the same type as suspension springs 3a, 3b of oscillating masses 2a, 2b, i.e. in the form of meanders presenting one or more successive U-shaped branches in one and the same plane parallel to the substrate.

Figure 5:
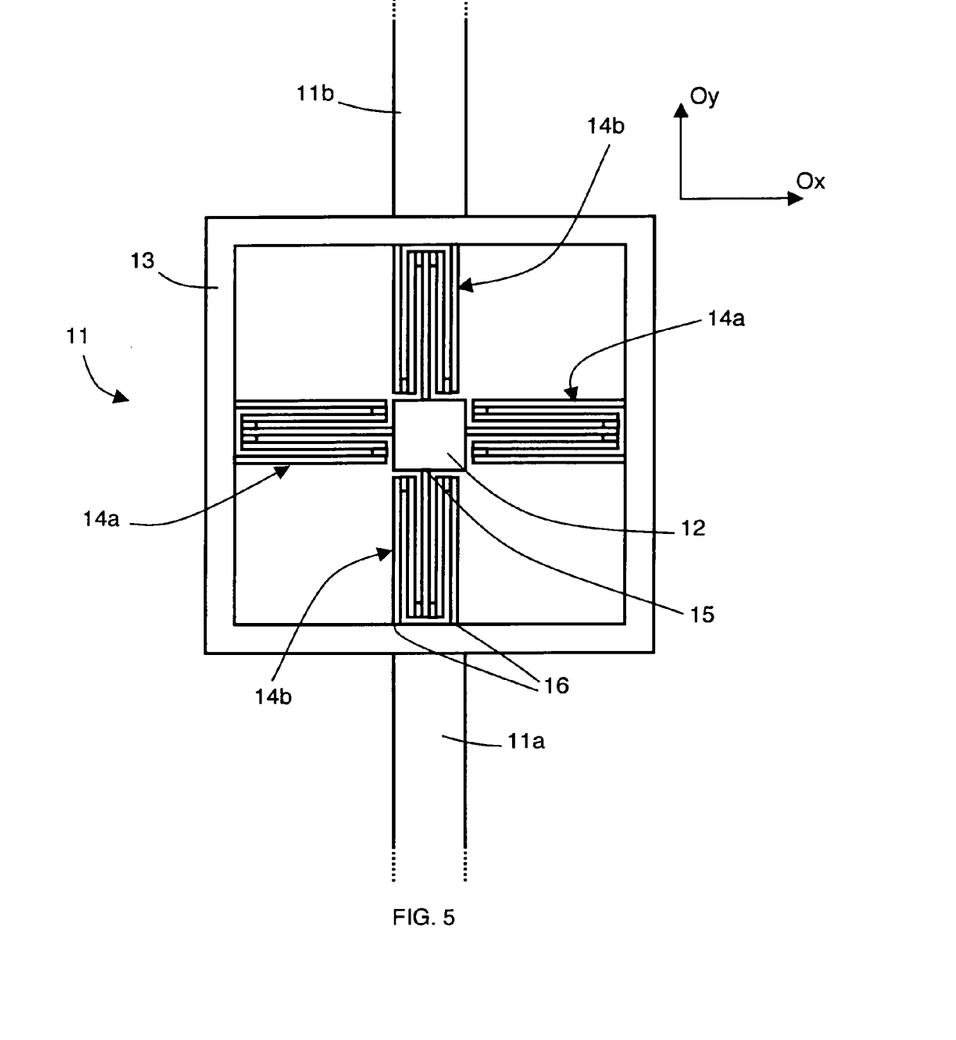

In the alternative embodiment represented in FIG. 5, coupling bar 11 differs from coupling bars 11 represented in FIGS. 3 and 4 by articulation springs 14. In FIG. 5, articulation springs 14a and 14b arranged perpendicularly to one another as described in FIG. 3, each comprise a first end 15 connected to pivot 12, arranged in the centre of frame 13, and two other ends 16 connected to frame 13.

Each articulation spring 14 thereby forms a more compact spring with two U-shaped branches symmetrical with respect to end 15 of the branch of spring 14 connected to pivot 12. Such a configuration of suspension springs 14, with one end 15 connected to pivot 12 and two ends 16 connected to frame 13, in particular allows the system in rotation of coupling bar 11 to be symmetric.

Figure 6:
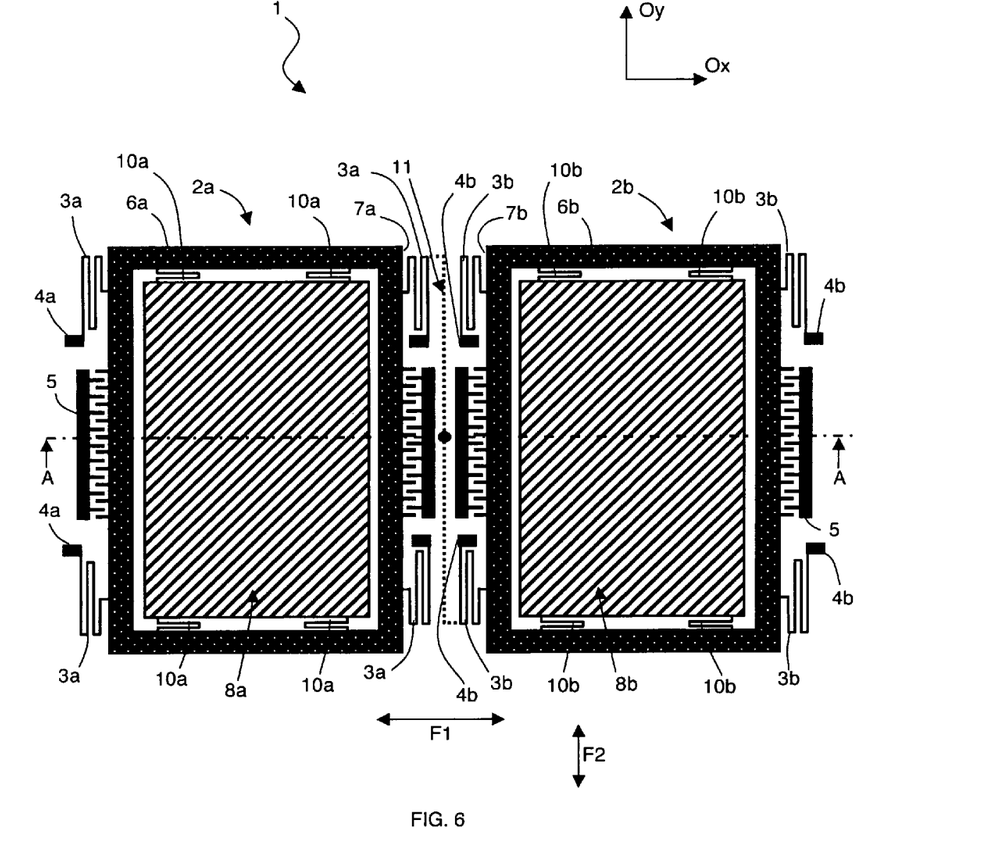
FIG. 6 schematically represents a top view of an alternative embodiment of a microsystem according to the invention, more particularly a microgyrometer, with two mechanically coupled oscillating masses.

In FIG. 6, the alternative embodiment of microgyrometer 1 differs from microgyrometer 1 represented in FIG. 1 by coupling bar 11 connecting suspension springs 3a, 3b of oscillating masses 2a, 2b. Each oscillating mass 2a, 2b comprises two suspension springs 3a, 3b on its side 7a, 7b, i.e. one suspension spring 3a, 3b towards each edge of opposite sides 7a, 7b. Coupling bar 11 connects a suspension spring 3a of oscillating mass 2a, arranged towards a first edge of side 7a, to suspension spring 3b of oscillating mass 2b, arranged towards a second edge of opposite side 7b.

Coupling bar 11 thereby connects two suspension springs 3a, 3b arranged in opposition on the opposite sides 7a and 7b and arranged on each side of an axis AA passing through the central part of oscillating masses 2a, 2b, parallel to excitation direction Ox. Coupling bar 11 is therefore longer than coupling bars 11 represented in FIG. 1 and articulation in rotation of coupling bar 11 takes place in the same way as before, according to the different embodiments represented in FIGS. 3 to 5.

In the particular embodiment of FIG. 6, anchoring points 4a, 4b of suspension springs 3a, 3b of oscillating masses 2a, 2b are arranged towards the central part of oscillating masses 2a, 2b. All the suspension springs 3a, 3b of oscillating masses 2a, 2b are therefore symmetrical with respect to coupling bar 11. This results in particular in manufacture of such a microgyrometer 1 being made simpler.

Moreover, anchoring points 4a, 4b being placed substantially in the centre of microgyrometer 1 and on each side of axis AA parallel to the excitation direction and passing substantially through the centre of microgyrometer 1, coupling bar 11 connects the mobile ends, which are preferably thicker than the rest of the branches as represented in FIG. 2, of the last branches of associated suspension springs 3a, 3b placed on each side of axis AA, to the opposite sides 7a, 7b of associated oscillating masses 2a, 2b. As before, this configuration of microgyrometer 1, with a symmetrical cross-linking of predetermined zones of suspension springs 3a, 3b with the same amplitude of movement, in particular enables an identical movement of suspension springs 3a, 3b to be kept to optimize operation of microgyrometer 1.

In general manner, whatever the embodiment of microgyrometer 1 (FIGS. 1 and 6) and whatever the embodiment of the articulation in rotation of coupling bar 11 (FIGS. 3 to 5), suspension springs 3a, 3b are coupled at the level of an intermediate connecting zone defined by a point situated between their end fixed to excitation frame 6a, 6b and their end fixed to corresponding anchoring point 4a, 4b.

Coupling by suspension springs 3a, 3b in particular enables coupling of oscillating masses 2a, 2b to be obtained without having to have an exactly identical movement of the two oscillating masses 2a, 2b. Microgyrometer 1 then accepts slight technological variations between the two oscillating masses 2a, 2b.

Moreover, articulation pivot 12 in rotation (FIGS. 3 to 5) forces movement of the two oscillating masses 2a, 2b in anti-phase mode, which then corresponds to the first resonance mode of microgyrometer 1 (FIGS. 1 and 6). This results in a certain freedom as regards the amplitude of vibration, which gives microgyrometer 1 more flexibility.

Coupling "in opposition" of suspension springs 3a, 3b (FIGS. 1 and 6) thereby enables operation of microgyrometer 1 to be optimized with forced movement in anti-phase mode.

In addition, coupling bar 11 and articulation pivot 12 in rotation give microgyrometer 1 an enhanced flexibility of operation (FIGS. 3 to 5).

Furthermore, movement of coupling bar 11 in rotation is reduced with respect to the movement of oscillating masses 2a, 2b, in particular according to the number of U-shaped branches of the meanders constituting suspension springs 3a, 3b. The mechanical stiffness of the articulation in rotation is then less critical.

The microgyrometer, as represented in FIGS. 1 and 6, thereby presents an optimized operation in particular due to mechanical coupling of oscillating masses 2a, 2b at the level of their suspension springs 3a, 3b. In addition, rigid coupling bar 11 and articulation pivot 12 in rotation enable the vibration mode to be forced to anti-phase mode to ensure good efficiency of the Coriolis force measurements.

The invention is not limited to the different embodiments described above. The position of the intermediate zone of corresponding suspension springs 3a, 3b for connection of coupling bar 11 can be different, provided it enables the mode of vibration to be forced to anti-phase mode of oscillating masses 2a, 2b.

Interdigital capacitive combs 5 of oscillating masses 2a, 2b can be replaced by any other excitation means causing vibration of oscillating masses 2a, 2b in excitation direction Ox.

Suspension springs 3a, 3b can be replaced by any other type of elastic suspension means, provided they enable mechanical coupling of oscillating masses 2a, 2b and optimal operation of microgyrometer 1.

The form and type of articulation springs 14 can be different, provided they enable a good articulation in rotation of coupling bar 11.

The invention claimed is:

1. A microsystem comprising:
    a substrate;
    a first oscillating mass and a second oscillating mass adjacent the first oscillating mass, each of the first and second oscillating masses having a first side and a second side opposite the first side, the first side of the first oscillating mass facing the second side of the second oscillating mass;
    an excitation device that drives the first and second oscillating masses in an excitation direction;
    a first elastic suspension having a first end fixed to the first side of the first oscillating mass, a second end fixed to the substrate by a first anchoring point, and a first intermediate zone arranged between the first end and the second end, the first elastic suspension having a first stiffness constant in the excitation direction and a second stiffness constant in another direction, the second stiffness constant being larger than the first stiffness constant;
    a second elastic suspension having a first end fixed to the second side of the second oscillating mass, a second end fixed to the substrate by a second anchoring point, and a second intermediate zone arranged between the first end and the second end, the second elastic suspension having a first stiffness constant in the excitation direction and a second stiffness constant in another direction, the second stiffness constant being larger than the first stiffness constant, wherein the first and second intermediate zones of the first and second elastic suspensions are placed on either side of an axis parallel to the excitation direction; and
    a coupling device coupling the first oscillating mass with the second oscillating mass and configured to produce an anti-phase movement of the first and second oscillating masses during excitation in the excitation direction, the first intermediate zone of the first elastic suspension being attached to the second intermediate zone of the second elastic suspension by the coupling device.

2. The microsystem according to claim 1, wherein the first and second elastic suspensions are disposed between the first side of the first oscillating mass and the second side of the second oscillating mass.

3. The microsystem according to claim 1, wherein the first and second oscillating masses each comprise an excitation frame surrounding a mobile detection element the first end of each of the first and second elastic suspensions is fixed to the excitation frame.

4. The microsystem according to claim 1, wherein the first and second elastic suspensions are suspension springs in the form of meanders, each of the first and second elastic suspensions comprising a plurality of branches parallel to each other, a first branch of the first elastic suspension is fixed to the first anchoring point and is oriented in a first direction, and a first branch of the second elastic suspension is fixed to the second anchoring point and is oriented in a second direction opposite to the first direction.

5. The microsystem according to claim 4, wherein each of the first and second intermediate zones is formed in the first branch.

6. The microsystem according to claim 1, wherein the coupling device is configured to attach the first intermediate zone of the first elastic suspension and the second intermediate zone of the second elastic suspension with a symmetrical cross-linking of the first and the second elastic suspensions whereby the first and the second intermediate zones present the same amplitude of movement during excitation.

7. The microsystem according to claim 1, wherein said coupling device comprises a rigid coupling bar articulated in rotation around a pivot firmly secured to the substrate and comprising two sections respectively connected to the first and the second intermediate zones of the first and second elastic suspensions.

8. The microsystem according to claim 7, wherein the first and second elastic suspensions are symmetric according to the pivot.

9. The microsystem according to claim 7, wherein the coupling bar comprises:
    a rigid frame on which sections of the bar are fixed, the pivot being arranged in a center of the rigid frame, and articulation springs arranged inside the rigid frame, and each articulation spring comprising one first end connected to the rigid frame and one second end connected to the pivot.

10. The microsystem according to claim 9, wherein the coupling bar comprises two first articulation springs separated by the pivot and aligned with the pivot in a first alignment direction and the first articulation springs have an axis of leak stiffness oriented perpendicular to the excitation direction.

11. The microsystem according to claim 10, wherein the coupling bar comprises two second articulation springs, separated by the pivot and aligned with the pivot in a second alignment direction perpendicular to the first alignment direction, and the second articulation springs have an axis of least stiffness oriented perpendicular to the excitation direction.

12. The microsystem according to claim 9, wherein the articulation springs are springs in the form of meanders.

13. The microsystem according to claim 1, wherein the first and second anchoring points are placed on either side of an additional axis parallel to the excitation direction, and passing through a center of the first elastic suspension and a center of the second elastic suspension.

14. The microsystem according to claim 12, wherein the additional axis passes successively through the first oscillating mass, the first elastic suspension, the second elastic suspension, and the second oscillating mass.

15. The microsystem according to claim 1, wherein the first and second elastic suspensions are placed on either side of an additional axis parallel to the excitation direction, and pass through a center of the first oscillating mass and a center of the second oscillating mass.

* * * * *